(12) United States Patent
Bittner et al.

(10) Patent No.: US 11,141,755 B2
(45) Date of Patent: Oct. 12, 2021

(54) PIEZOELECTRIC JETTING SYSTEM AND METHOD WITH AMPLIFICATION MECHANISM

(71) Applicant: NORDSON CORPORATION, Westlake, OH (US)

(72) Inventors: Doug Bittner, Auburn, MA (US); John D. Jones, Cranston, RI (US); Bryan Teece, Fall River, MA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 15/160,726

(22) Filed: May 20, 2016

(65) Prior Publication Data

US 2016/0339471 A1 Nov. 24, 2016

Related U.S. Application Data

(60) Provisional application No. 62/165,244, filed on May 22, 2015.

(51) Int. Cl.
  *B05B 1/30* (2006.01)
  *B05C 5/02* (2006.01)
  (Continued)

(52) U.S. Cl.
  CPC .......... *B05C 5/0225* (2013.01); *B05B 1/3046* (2013.01); *B05C 11/1034* (2013.01);
  (Continued)

(58) Field of Classification Search
  CPC . B05C 5/0225; B05C 11/1034; H05K 3/0085; H05K 2203/0126; H01L 21/67126; H01L 21/6715
  (Continued)

(56) References Cited

U.S. PATENT DOCUMENTS

| | | | |
|---|---|---|---|
| 4,460,842 A | | 7/1984 | Waanders et al. |
| 5,024,587 A | * | 6/1991 | Maurer ............... F04B 7/045 222/333 |

(Continued)

FOREIGN PATENT DOCUMENTS

| | | |
|---|---|---|
| CN | 1666352 A | 9/2005 |
| CN | 104903578 A | 9/2015 |

(Continued)

OTHER PUBLICATIONS

International Application No. PCT/US2016/033593: International Search Report and The Written Opinion dated Sep. 7, 2016, 10 pages.

(Continued)

*Primary Examiner* — Chee-Chong Lee
(74) *Attorney, Agent, or Firm* — BakerHostetler

(57) ABSTRACT

A jetting dispenser includes an actuator with a piezoelectric unit that lengthens by a first distance in response to an applied voltage, and an amplifier operatively coupled to the piezoelectric unit. The amplifier includes first and second ends and the second end moves through a second distance, larger than the first distance under the applied voltage. First and second springs are positioned on opposite sides of the piezoelectric unit. The springs are coupled to the piezoelectric unit in a manner that maintains the piezoelectric unit under constant compression. A fluid body includes a movable shaft operatively coupled with the second end of the amplifier and includes a fluid bore and an outlet orifice. The movable shaft is moved by the second end of the amplifier under the applied voltage and jets an amount of fluid from the fluid bore through the outlet orifice.

20 Claims, 6 Drawing Sheets

(51) Int. Cl.
  *H05K 3/00* (2006.01)
  *B05C 11/10* (2006.01)
  *H01L 21/67* (2006.01)

(52) U.S. Cl.
  CPC ........ *H05K 3/0085* (2013.01); *H01L 21/6715* (2013.01); *H01L 21/67126* (2013.01); *H05K 2203/0126* (2013.01)

(58) Field of Classification Search
  USPC .......................................................... 239/4
  See application file for complete search history.

(56) References Cited

U.S. PATENT DOCUMENTS

| | | | |
|---|---|---|---|
| 5,720,417 | A | 2/1998 | Wurth et al. |
| 6,452,308 | B1 | 9/2002 | Heinz et al. |
| 7,762,088 | B2 * | 7/2010 | Fiske ............... B05C 5/001 62/3.64 |
| 8,590,743 | B2 * | 11/2013 | Beland ............ B65D 83/205 222/1 |
| 9,296,008 | B2 | 3/2016 | Mueller et al. |
| 9,457,935 | B2 | 10/2016 | Fliess et al. |
| 2002/0166542 | A1 * | 11/2002 | Kirzhner .......... F02M 51/0603 123/498 |
| 2004/0035106 | A1 * | 2/2004 | Moler ............... F16K 27/003 60/527 |
| 2006/0097010 | A1 | 5/2006 | Riney |
| 2014/0263688 | A1 | 9/2014 | Forget et al. |
| 2016/0136661 | A1 | 5/2016 | Hong et al. |

FOREIGN PATENT DOCUMENTS

| | | | | |
|---|---|---|---|---|
| CN | 105008872 | A | 10/2015 | |
| DE | 4325143 | C1 | 12/1994 | |
| DE | 4411569 | C1 | 7/1995 | |
| DE | 10310787 | A1 | 9/2004 | |
| DE | 102012109123 | A1 | 3/2014 | |
| EP | 2256388 | B1 | 1/2015 | |
| EP | 2667977 | B1 | 2/2016 | |
| JP | 06277597 | A | 10/1994 | |
| JP | 07-275768 | A | 10/1995 | |
| JP | 10-284763 | A | 10/1998 | |
| JP | 10-318076 | A | 12/1998 | |
| JP | 2002-532051 | A | 9/2002 | |
| JP | 2006-507663 | A | 3/2006 | |
| JP | 2006-122905 | A | 5/2006 | |
| JP | 2016-098828 | A | 5/2016 | |
| KR | 10-2013-0096739 | | * 11/2014 | ............ F04B 17/003 |
| KR | 10-1462262 | B1 | 11/2014 | |
| WO | WO9503894 | A1 | 2/1995 | |
| WO | 2014/048643 | A1 | 4/2014 | |

OTHER PUBLICATIONS

International Patent Application No. PCT/US2016/033593; Int'l Preliminary Report on Patent Ability; dated Dec. 7, 2017; 7 pages.
International Application No. PCT/US2016/033593: Objections by Third Parties dated Apr. 14, 2017, 15 pages.

* cited by examiner

PIEZOELECTRIC JETTING SYSTEM AND METHOD WITH AMPLIFICATION MECHANISM

CROSS-REFERENCE TO RELATED APPLICATIONS

This application claims priority to provisional U.S. Patent App. No. 62/165,244, filed May 22, 2015, the entire contents of which is incorporated herein by reference.

TECHNICAL FIELD

The present invention generally relates to non-contact, jetting dispensers for depositing small droplets of a viscous fluid onto a substrate, and more specifically, to dispensers of this type that are actuated by one or more piezoelectric elements.

BACKGROUND

Non-contact viscous material dispensers are often used to apply minute amounts of viscous materials, e.g., those with a viscosity exceeding fifty centipoise, onto substrates. For example, non-contact viscous material dispensers are used to apply various viscous materials onto electronic substrates like printed circuit boards. Viscous materials applied to electronic substrates include, by way of example and not by limitation, general purpose adhesives, ultraviolet curable adhesives, solder paste, solder flux, solder mask, thermal grease, lid sealant, oil, encapsulants, potting compounds, epoxies, die attach fluids, silicones, RTV, and cyanoacrylates.

Specific applications abound for dispensing viscous materials from a non-contact jetting dispenser onto a substrate. In semiconductor package assembly, applications exist for underfilling, solder ball reinforcement in ball grid arrays, dam and fill operations, chip encapsulation, underfilling chip scale packages, cavity fill dispensing, die attach dispensing, lid seal dispensing, no flow underfilling, flux jetting, and dispensing thermal compounds, among other uses. For surface-mount technology (SMT) printed circuit board (PCB) production, surface mount adhesives, solder paste, conductive adhesives, and solder mask materials may be dispensed from non-contact dispensers, as well as selective flux jetting. Conformal coatings may also be applied selectively using a non-contact dispenser. Generally, the cured viscous materials protect printed circuit boards and mounted devices thereupon from harm originating from environmental stresses like moisture, fungus, dust, corrosion, and abrasion. The cured viscous materials may also preserve electrical and/or heat conduction properties on specific uncoated areas. Applications also exist in the disk drive industry, in life sciences applications for medical electronics, and in general industrial applications for bonding, sealing, forming gaskets, painting, and lubrication.

Jetting dispensers generally may have pneumatic or electric actuators for moving a shaft or tappet repeatedly toward a seat while jetting a droplet of viscous material from an outlet orifice of the dispenser. The electrically actuated jetting dispensers can, more specifically, use a piezoelectric actuator. Piezo stacks are very accurate and extremely fast reacting ceramic devices. A property of the piezo stack is that when a voltage is applied the ceramic material will perform a displacement in one direction. One main drawback is that the piezo stack produces a very small displacement. For example, a 7 mm×7 mm×36 mm long stack produces about 36 microns of movement. This displacement is not enough for proper jetting of fluids. It is known to form an actuator with a piezo stack and an amplification mechanism. Space limitations and life expectancy are also considerations when designing an actuator that includes a piezo material. Life expectancy is severely shortened when the stack is placed in a tension condition. The piezo stack needs to be able to operate at a frequency of 1000 Hz continuous, and needs to apply sufficient force to reliably and accurately jet a small amount of fluid. There are a wide variety of methods of achieving the amplification that is necessary for this application, however achieving long life cycles $10^9$ can be challenging. The two main methods of rocker arm or lever amplification are pivot and flexural. The pivot method is susceptible to wear which will reduce the overall displacement, and the flexural method is prone to breakage around areas of high stress.

A piezo stack produces a significant amount of heat during operation. The amount of heat generated by the actuator is dependent on several factors such as heater body temperature, piezo frequency, and duty cycle. This heat is transferred to the surrounding metal in the actuator. This results in a change in the position of the lever or rocker arm and can negatively affect the intended stroke of the jetting device.

For at least these reasons, it would be desirable to provide a jetting system and method that addresses these and other issues.

SUMMARY

In a first illustrative embodiment the invention provides a jetting dispenser including an actuator and a fluid body. The actuator includes a piezoelectric unit that lengthens by a first distance in response to an applied voltage, and an amplifier operatively coupled to the piezoelectric unit. The actuator further comprises a pair of springs positioned on opposite sides of the piezoelectric unit. The springs are coupled to the piezoelectric unit in a manner that maintains the piezoelectric unit under constant compression. The dispenser further includes a fluid body with a movable shaft operatively coupled with the amplifier and including a fluid bore and an outlet orifice. The movable shaft is moved by the amplifier when voltage is applied to and removed from the piezoelectric unit and thereby moving the movable shaft to jet an amount of fluid from the fluid bore through the outlet orifice.

The dispenser may include additional or alternative aspects in various embodiments. For example, the pair of springs further comprise first and second flat springs. The actuator may further comprise an upper actuator portion, and the first and second flat springs each include a first end and a second end. The first ends are fixed to the upper actuator portion and the second ends are fixed for movement with the amplifier under the applied voltage. The second ends are fixed to an armature coupled to the amplifier. The armature is moved by the piezoelectric unit as the voltage is applied and removed.

In another embodiment, the invention provides a jetting dispenser comprising an actuator including a piezoelectric unit that lengthens by a first distance in response to an applied voltage, an upper actuator portion containing the piezoelectric unit, and a lower actuator portion including an amplifier operatively coupled to the piezoelectric unit. The amplifier includes first and second ends and the second end moves through a second distance, larger than the first distance under the applied voltage. The upper actuator portion is formed from a first material having a first coefficient of thermal expansion and the lower actuating portion is formed from a second material having a second coefficient of thermal expansion. The first coefficient of thermal expansion is lower than the second coefficient of thermal expansion. The jetting dispenser further includes a fluid body with a movable shaft operatively coupled with the second end of the amplifier and including a fluid bore and an outlet orifice. The movable shaft is moved by the second end of the amplifier under the applied voltage and thereby jets an amount of fluid from the fluid bore through the outlet orifice. As examples, the ratio of the first coefficient of thermal expansion to the second coefficient of thermal expansion may be at least 1:5 or at least 1:10. In one embodiment the material forming the lower actuator portion comprises stainless steel and the material forming the upper actuating portion comprises an alloy. The alloy may further comprise a nickel-iron alloy.

In another embodiment, the invention provides a jetting dispenser comprising an actuator including a piezoelectric unit that lengthens by a first distance in response to an applied voltage, an upper actuator portion containing the piezoelectric unit, and a lower actuator portion including an amplifier operatively coupled to the piezoelectric unit. The amplifier includes first and second ends and the second end moves through a second distance, larger than the first distance under the applied voltage. The amplifier is formed integrally with the lower actuator portion and includes a flexural portion formed by a series of slots in the lower actuator portion. The jetting dispenser further comprises a fluid body including a movable shaft operatively coupled with the second end of the amplifier and including a fluid bore and an outlet orifice. The movable shaft is moved by the second end of the amplifier and thereby jets an amount of fluid from the fluid bore through the outlet orifice.

In another embodiment, the invention provides an actuator comprising a piezoelectric unit and a fluid body. The piezoelectric unit lengthens by a first distance in response to an applied voltage. An upper actuator portion contains the piezoelectric unit, and a lower actuator portion includes an amplifier operatively coupled to the piezoelectric unit. The amplifier includes first and second ends. The second end moves through a second distance, larger than the first distance under the applied voltage. The amplifier is formed integrally with the lower actuator portion and includes a flexural portion. The fluid body includes a movable shaft operatively coupled with the second end of the amplifier and further includes a fluid bore and an outlet orifice. The movable shaft is moved by the second end of the amplifier and thereby jets an amount of fluid from the fluid bore through the outlet orifice.

In another embodiment, the invention provides an amplifier for producing a mechanically amplified movement of a piezoelectric actuator from a first distance to a second distance under an applied voltage. More specifically, a portion of the amplifier moves a second distance, which is larger than the first distance, when a voltage is applied to the piezoelectric actuator. The amplifier includes an armature adapted to be coupled for movement with the piezoelectric actuator under the applied voltage. The armature is formed integrally with a flexural portion including a plurality of slots for providing flexure when the piezoelectric actuator moves through the first distance. The amplifier further includes a lever having first and second ends. The second end moves through the second distance, larger than the first distance, under the applied voltage.

In another embodiment, a method of jetting fluid using an actuator including a piezoelectric unit, an amplifier coupled to the piezoelectric unit, and a pair of springs positioned on opposite sides of the piezoelectric unit includes maintaining a constant compression of the piezoelectric unit with the pair of springs. A voltage is applied to the piezoelectric unit to cause the piezoelectric unit to lengthen by a first distance caused by the lengthening of the piezoelectric unit. The amplifier is actuated by a second distance, second distance larger than the first distance. Caused by the actuation of the amplifier, a movable shaft of a fluid body is moved to jet an amount of the fluid from a fluid bore in the fluid body through an outlet orifice.

The above method may include additional or alternative aspects. For example, the pair of springs may further comprise first and second flat springs. In an aspect, the actuator may further comprise an upper actuator portion, and the first and second flat springs each may include a first end and a second end, the first ends being fixed to the upper actuator portion, and the method may further comprise moving the second ends with the amplifier under the applied voltage to the piezoelectric unit. In another aspect, the method may further comprise moving an armature, coupled to the amplifier and the second ends of the first and second flat springs, as the voltage is applied and removed. In another aspect, the actuator may further comprise a lower actuator portion including the amplifier, the upper actuator portion formed from a first material having a first coefficient of thermal expansion and the lower actuator portion formed from a second material having a second coefficient of thermal expansion, wherein the first coefficient of thermal expansion is lower than the second coefficient of thermal expansion. In yet another aspect, the amplifier may include a first end operatively coupled with the armature and a second end operatively coupled with the movable shaft and the method may further comprise moving the second end of the amplifier through the second distance.

In another embodiment, a method of mechanically amplifying a movement of a piezoelectric actuator through a first distance includes, under a voltage applied to the piezoelectric actuator, moving a first end of a lever through the first distance, the first end of the lever operatively coupled with the piezoelectric actuator. The method further includes moving a second end of the lever through a second distance, larger than the first distance, under the applied voltage.

The above method may include additional or alternative aspects. For example, the method may further comprise, under the voltage applied to the piezoelectric actuator, moving an armature coupled to the piezoelectric actuator; and flexing a flexural portion when the piezoelectric actuator moves through the first distance, the flexural portion formed integrally with the armature and operatively coupled with the lever. In another aspect, the flexural portion may include a plurality of slots for providing the flexing of the flexural portion Various additional features and advantages of the invention will become more apparent to those of ordinary skill in the art upon review of the following detailed description of the illustrative embodiments taken in conjunction with the accompanying drawings.

DETAILED DESCRIPTION

Figure 1:
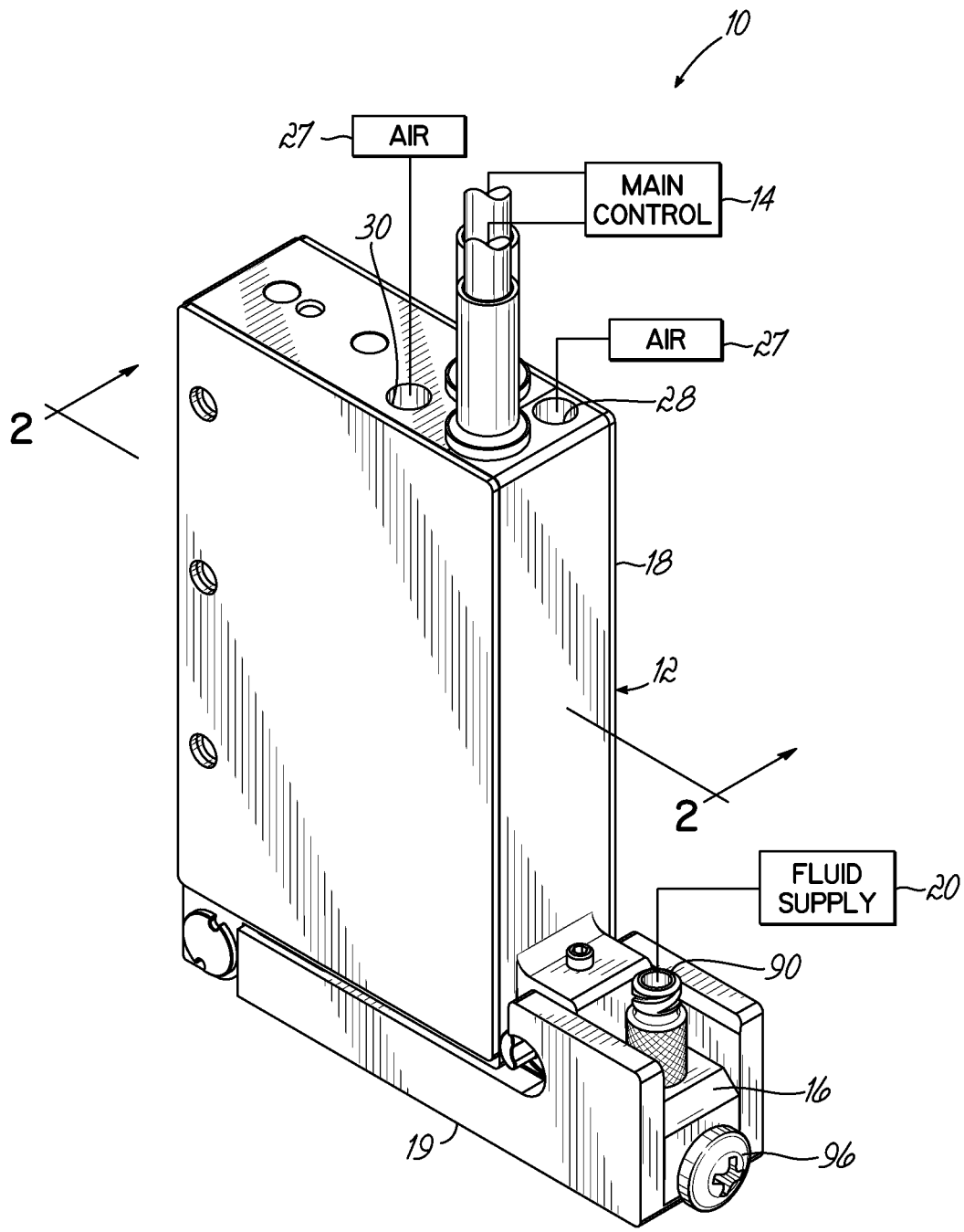
FIG. 1 is a perspective view of a jetting dispenser system according to an illustrative embodiment of the invention.

Referring to FIGS. 1 through 4, a jetting system 10 in accordance with an embodiment of the invention generally comprises a jetting dispenser 12 coupled with a main electronic control 14. The jetting dispenser 12 includes a fluid body 16 coupled to an actuator housing 18. More specifically, the fluid body 16 is held within a fluid body housing 19, which may include one or more heaters (not shown), depending on the needs of the application. The fluid body 16 receives fluid under pressure from a suitable fluid supply 20, such as a syringe barrel (not shown). A tappet or valve assembly 22 is coupled to the housing 18 and extends into the fluid body 16. A mechanical amplifier (e.g., a lever 24) is coupled between a piezoelectric actuator 26 and the tappet or valve assembly 22, as will be described further below.

Figure 2:
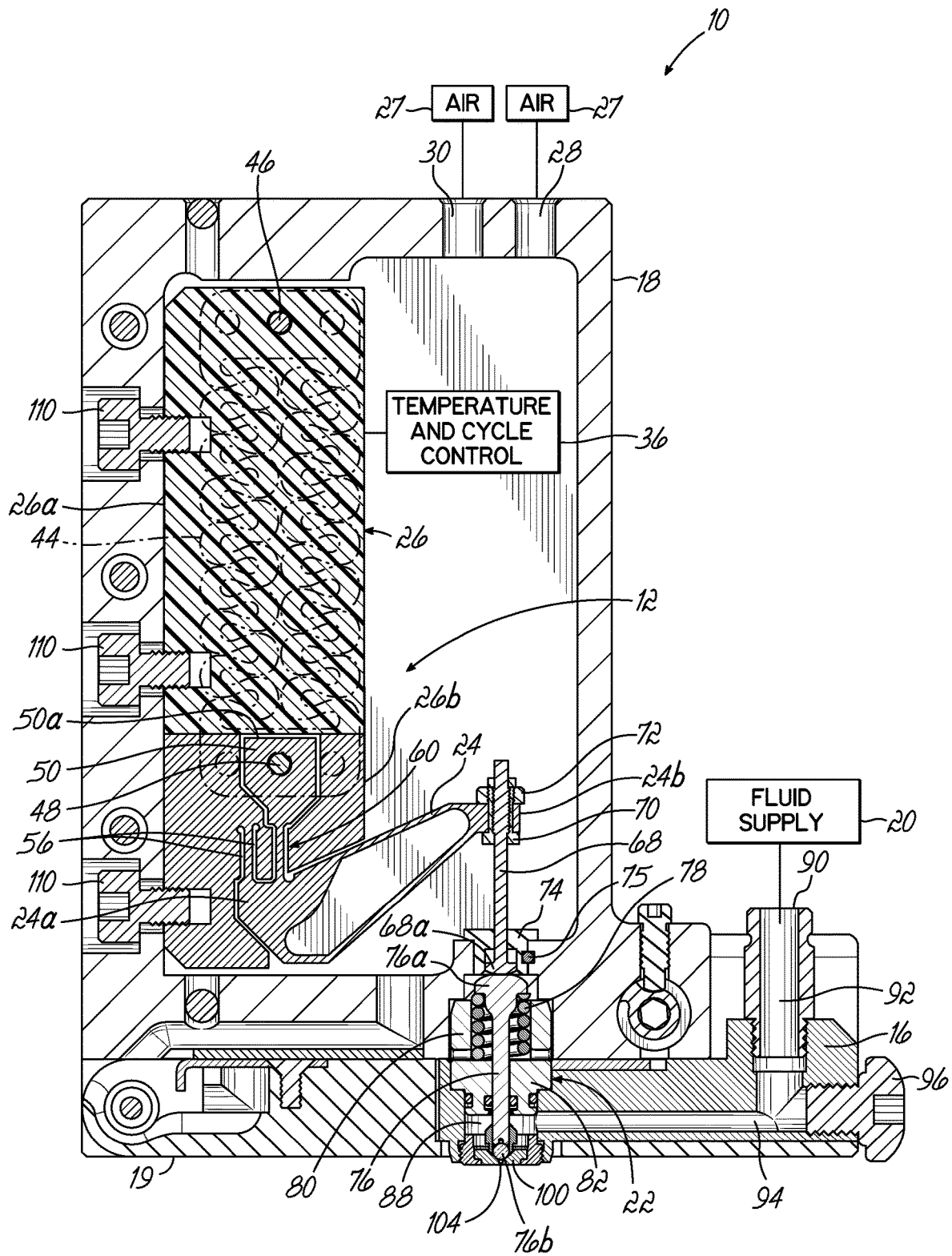
FIG. 2 is a cross sectional view taken along line 2-2 of FIG. 1.

For purposes of cooling the piezoelectric actuator 26, air may be introduced from a source 27 into an inlet port 28 and out from an exhaust port 30. Alternatively, depending on the cooling needs, both of the ports 28, 30 may receive cooling air from the source 27 as shown in FIG. 2. In such a case, one or more other exhaust ports (not shown) would be provided in the housing 18. A temperature and cycle control 36 is provided for cycling the actuator 26 during a jetting operation, and for controlling one or more heaters (not shown) carried by the dispenser 12 for maintaining the dispensed fluids to a required temperature. As another option, this control 36, or another control, may control the cooling needs of the actuator 26 in a closed loop manner. As further shown in FIG. 4, the piezoelectric actuator 26 further comprises a stack 40 of piezoelectric elements. This stack 40 is maintained in compression by respective flat, compression spring elements 42, 44 coupled on opposite sides of the stack 40. More specifically, upper and lower pins 46, 48 are provided and hold the flat spring elements 42, 44 to one another with the stack 40 of piezoelectric elements therebetween. The upper pin 46 is held within an upper actuator portion 26a of the actuator 26, while a lower pin 48 directly or indirectly engages a lower end of the stack 40. The upper actuator portion 26a securely contains the stack 40 of piezoelectric elements so that the stack 40 is stabilized against any sideward motion. In this embodiment, the lower pin 48 is coupled to a lower actuator portion 26b and, more specifically, to a mechanical armature 50 (FIG. 2).

An upper surface 50a of the mechanical armature 50 bears against the lower end of the piezoelectric stack 40. The spring elements 42, 44 are stretched between the pins 46, 48 such that the spring elements 42, 44 apply constant compression to the stack 40 as shown by the arrows 53 in FIG. 4. The flat spring elements 42, 44 may, more specifically, be formed from a wire EDM process. The upper end of the piezoelectric element stack 40 is retained against an internal surface of the upper actuator portion 26a. The upper pin 46 is therefore stationary while the lower pin 48 floats or moves with the spring elements 42, 44 and with the mechanical armature 50 as will be described.

When voltage is applied to the piezoelectric stack 40, the stack 40 expands or lengthens and this moves the armature 50 downward against the force of the spring elements 42, 44. The stack 40 will change length proportional to the amount of applied voltage.

As further shown in FIG. 2, the mechanical armature 50 is operatively coupled with a mechanical amplifier which, in this illustrative embodiment, is formed as the lever 24 coupled to the armature 50 generally near a first end 24a and coupled to a push rod 68 at a second end 24b. The lever 24 may be integrally formed from the lower actuator portion 26b through, for example, an EDM process that also forms a series of slots 56 between the mechanical armature 50 and the lever 24. As will be further discussed below, the lever 24 or other mechanical amplifier amplifies the distance that the stack 40 expands or lengthens by a desired amount. For example, in this embodiment, downward movement of the stack 40 and the mechanical armature 50 is amplified by about eight times at the second end 24b of the lever 24.

Now referring more specifically to FIGS. 2, 2A, 2B and 5, a flexural portion 60 couples the lever 24 to the mechanical armature 50. As shown best in FIG. 5, the lever 24 pivots about a pivot point 62 that is approximately at the same horizontal level as the second end 24b of the lever 24. This position of the pivot point 62 serves to minimize the effect of the arc through which the lever 24 rotates. The series of slots 56 is formed in the lower actuator portion 26b form the flexural portion 60. When the piezoelectric stack 40 lengthens under the application of a voltage by the main control 14 as shown by the arrow 66 in FIG. 5, the lever 24 rotates clockwise generally about the pivot point 62 as the stack 40 pushes downward on the mechanical armature 50. The slight rotation of the lever 24 takes place against a resilient bias applied by the flexural portion 60. As the second end 24b is rotating slightly clockwise about the pivot point 62, it moves downward and likewise moves an attached push rod 68 downward (FIG. 2) as indicated by the arrow 67 in FIG. 5.

Figure 2A:
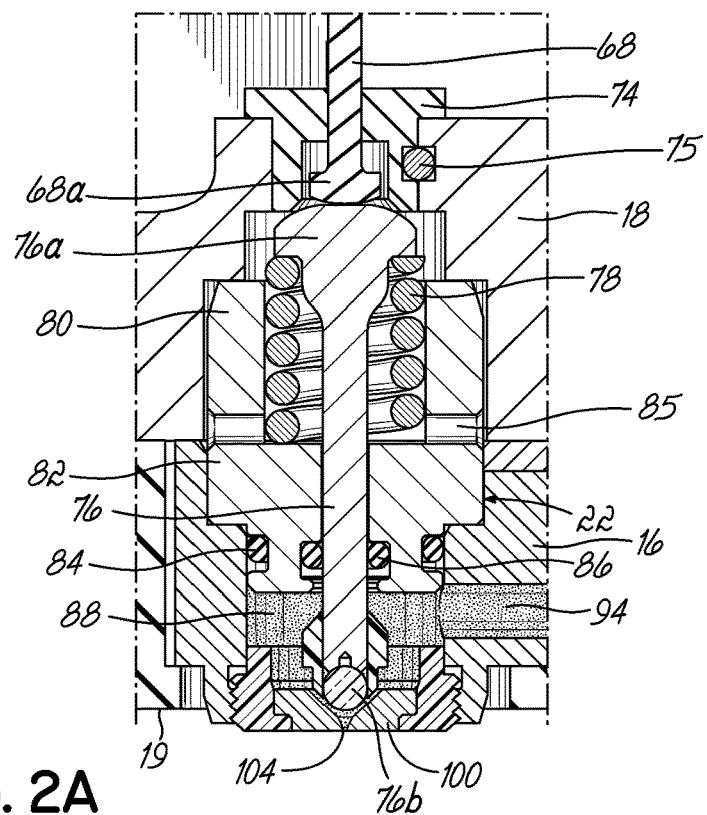
FIG. 2A is an enlarged cross sectional view of the tappet assembly and fluid body taken from FIG. 2, and showing the tappet in an open condition.
Figure 2B:
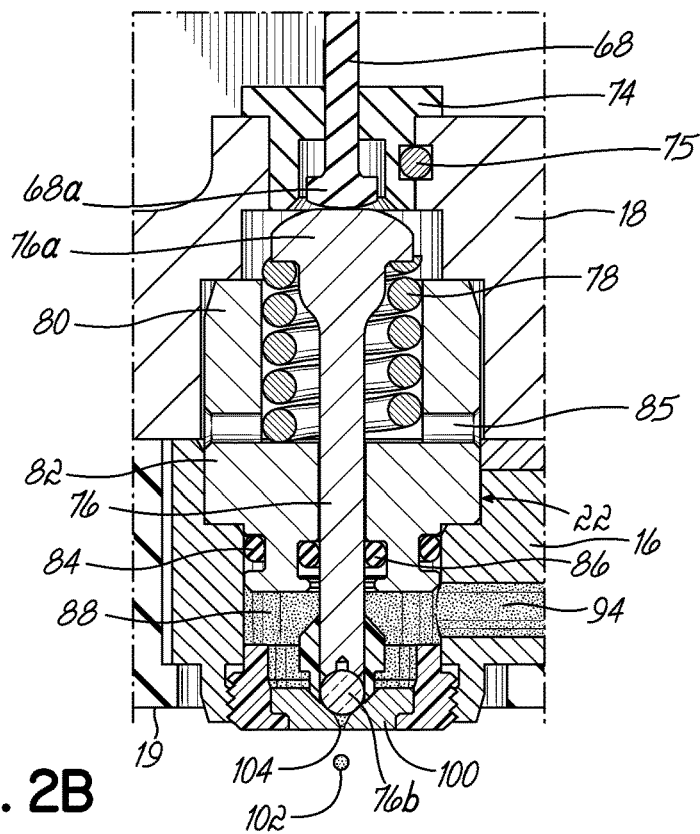
FIG. 2B is a cross sectional view similar to FIG. 2A, but showing the tappet in a closed position after jetting a droplet of fluid.

The second end 24b of the lever 24 is fixed to the push rod 68 using suitable threaded fasteners 70, 72. The push rod 68 has a lower head portion 68a that travels within a guide bushings 74 and bears against an upper head portion 76a of a tappet or valve element 76 associated with the tappet or valve assembly 22. The guide bushing 74 is held in the housing 18 by a pressfit with a pin 75 as best seen in FIGS. 2A and 2B. The assembly of the push rod 68, guide bushing 74 and pin 75 allows for some "give" to ensure proper movement of the push rod 68 during operation. In addition, the push rod 68 is made of a material that will slightly bend sideward, in an elastic manner, during its reciprocating movement with the tappet or valve element 76 and lever 24. The tappet assembly further comprises a coil spring 78 which is mounted within a lower portion of the housing 18 using an annular element 80. The tappet or valve assembly 22 further comprises an insert 82 retained in the fluid body 16 by an O-ring 84. The annular element 80 and the insert 82 comprise an integral element, i.e., a cartridge body in this embodiment. A cross-drilled weep hole 85 is approximately in line with the lower end of the spring 78 to allow any liquid that leaks past the O-ring 86 to escape. An additional O-ring 86 seals the tappet or valve element 76 such that pressurized fluid contained in a fluid bore 88 of the fluid body 16 does not leak out. Fluid is supplied to the fluid bore 88 from the fluid supply 20 through an inlet 90 of the fluid body 16 and passages 92, 94. The O-ring 84 seals the outside of the cartridge body formed by the annular element 80 and insert 82 from the pressurized liquid in bore 88 and passage 94. The fluid passages 92, 94 are sealed by a plug member 96 threaded into the fluid body 16. The plug member 96 may be removed to allow access for cleaning the internal passage 94.

Figure 3:
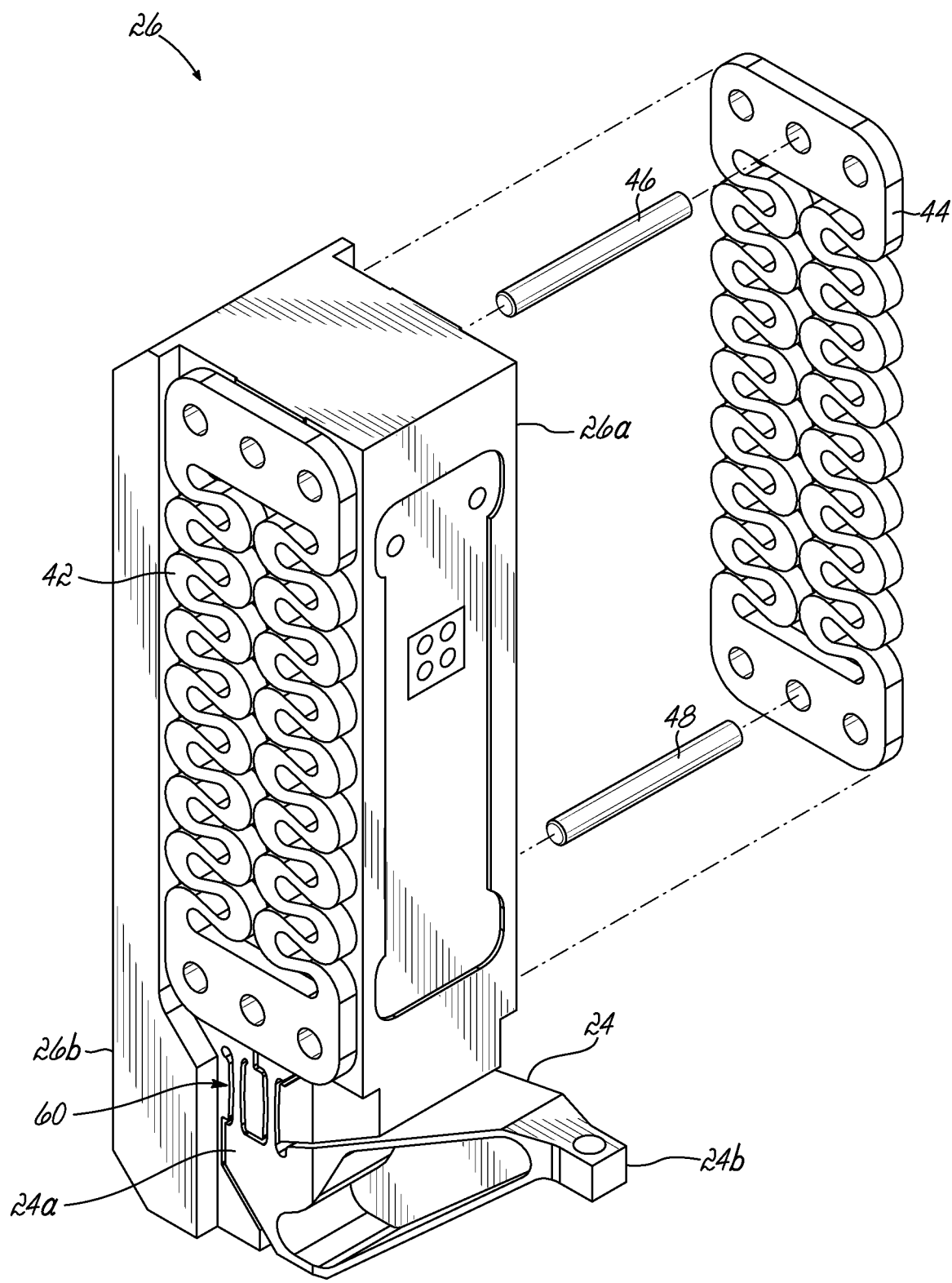
FIG. 3 is a partially exploded perspective view of a piezoelectric actuator of the dispenser.
Figure 4:
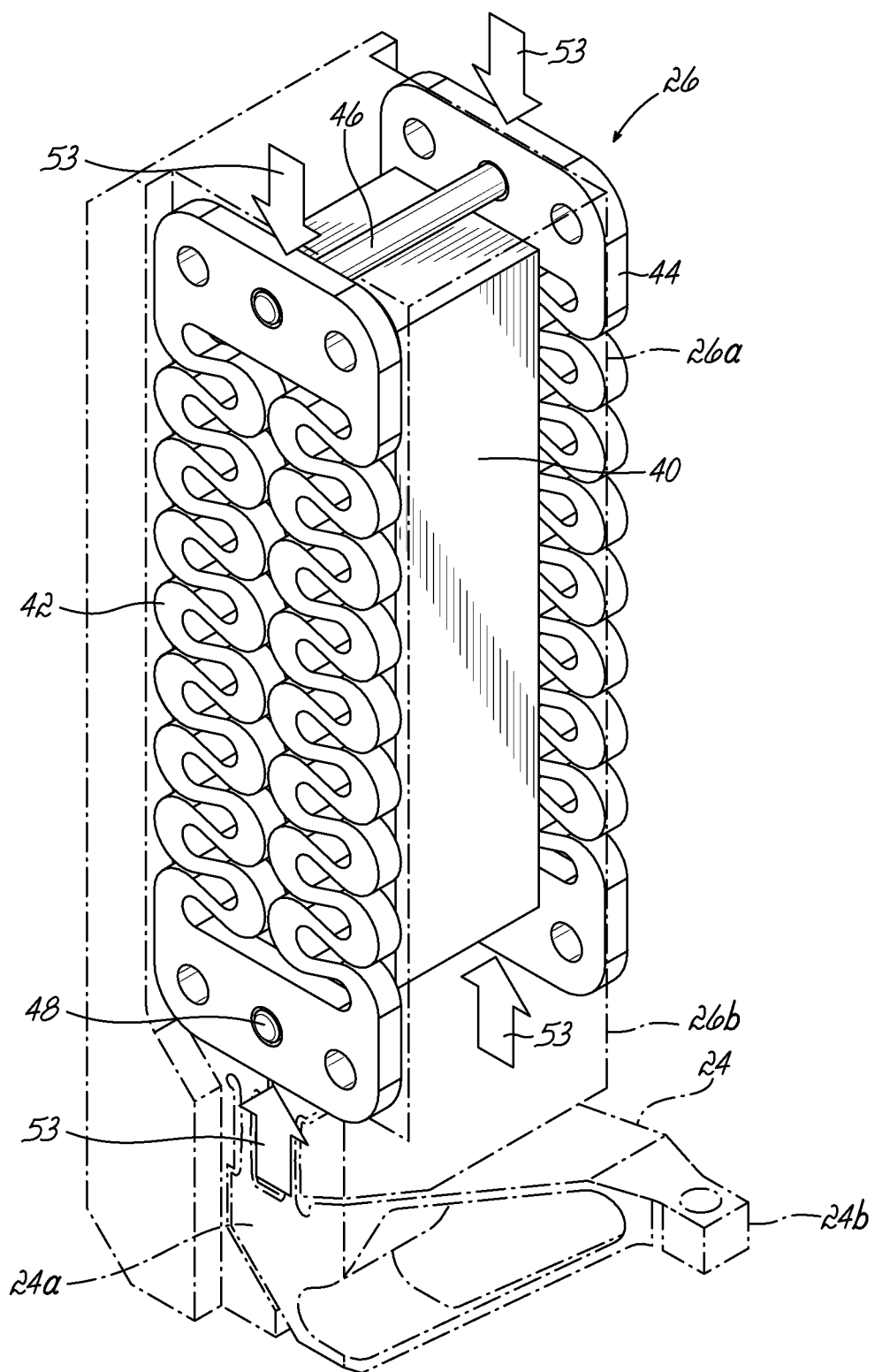
FIG. 4 is a perspective view of the piezoelectric jetting dispenser with certain elements shown in dashed lines to better show inner details.
Figure 5:
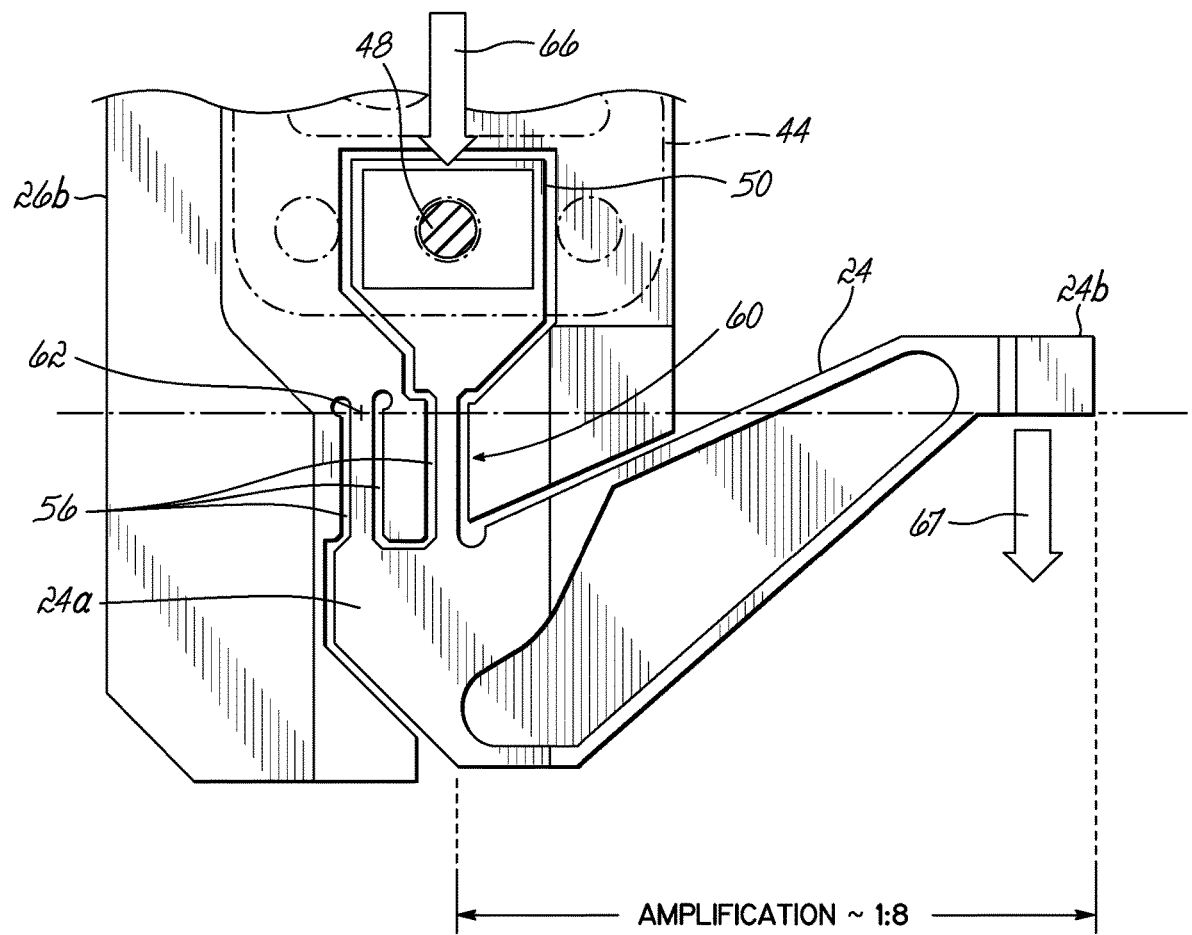
FIG. 5 is a side elevational view of a lower portion of the actuator illustrating a lever amplification mechanism.

The operation of the system 10 to jet droplets or small amounts of fluid will be best understood by reviewing FIGS. 2-4 in conjunction with FIGS. 2A and 2B. FIG. 2A illustrates the tappet or valve element 76 raised to an open condition when the voltage to the piezoelectric stack 40 has been sufficiently removed. This causes the stack 40 to contract. As the stack 40 contracts, the flat spring elements 42, 44 pull the armature 50 upward and this raises the second end 24b of the lever 24, and also raises the push rod 68. Thus, the coil spring 78 of the tappet or valve assembly 22 can then push upward on the upper head portion 76a of the tappet or valve element 76 and raise a distal end 76b of the tappet or valve element 76 off a valve seat 100 affixed to the fluid body 16. In this position, the fluid bore 88 and the area beneath the distal end 76b of the tappet or valve element 76 fills with additional fluid to "charge" the jetting dispenser 12 and prepare the jetting dispenser 12 for the next jetting cycle.

When the piezoelectric stack 40 is activated, i.e., when voltage is applied to the piezoelectric stack 40 by the main electronic control 14 (FIG. 1), the stack 40 expands and pushes against the mechanical armature 50. This rotates the lever 24 clockwise and moves the second end 24b downward, also moving the push rod 68 downward. The lower head portion 68a of the push rod 68 pushes down on the upper head portion 76a of the tappet or valve element 76 as shown in FIG. 2B and the valve element 76 moves quickly downward against the force of the coil spring 78 until the distal end 76b engages against the valve seat 100. In the process of movement, the distal end 76b of the valve element 76 forces a droplet 102 of fluid from a discharge outlet 104. Voltage is then removed from the piezoelectric stack 40 and this reverses the movements of each of these components to raise the tappet or valve element 76 for the next jetting cycle.

It will be appreciated that the piezoelectric actuator 26 may be utilized in reverse to jet droplets. In this case, the various mechanical actuation structures including the lever 24 would be designed differently such that when the voltage is removed from the piezoelectric stack 40, the resulting contraction of the stack 40 will cause movement of the valve element 76 toward the valve seat 100 and the discharge outlet 104 to discharge a droplet 102 of fluid. Then, upon application of the voltage to the stack 40, the amplification system and other actuation components would raise the valve element 76 in order to charge the fluid bore 88 with additional fluid for the next jetting operation. In this embodiment, the tappet or valve element 76 would be normally closed, that is, it would be engaging the valve seat 100 when there is no voltage applied to the piezoelectric stack 40.

As further shown in FIG. 2, the upper actuator portion 26a is separate from the lower actuator portion 26b and these respective portions 26a, 26b are formed from different materials. Specifically, the upper actuator portion 26a is formed from a material having a lower coefficient of thermal expansion than the material forming the lower actuator portion 26b. Each of the actuator portions 26a, 26b is securely fastened together using threaded fasteners (not shown) extending from the lower actuator portion 26b into the upper actuator portion 26a. The assembly of the upper and lower actuator portions 26a, 26b is then fastened to the housing by a plurality of bolts 110. More specifically, the lower actuator portion 26b may be formed from PH17-4 stainless steel, while the upper actuator portion 26a may be formed from a nickel-iron alloy, such as Invar. 17-4 PH stainless steel has a very high endurance limit, or fatigue strength, which increases the life of flexural portion 60. The coefficient of thermal expansion of this stainless steel is about 10 µm/m-C, while the coefficient of thermal expansion of Invar is about 1 µm/m-C. The ratio of the thermal expansions may be higher or lower than the approximate 10:1 ratio of these materials. The coefficients of thermal expansion associated with the upper and lower actuator portions 26a, 26b effectively provide offsetting characteristics to each other. The differing coefficients of thermal expansion of the upper and lower actuator portions 26a, 26b thereby allow the actuator 26 to operate consistently across a wider temperature range. Specifically, this temperature range allows the actuator 26 to be run at higher frequencies and with more aggressive waveforms. Also, piezo stacks, when operated at a high duty cycle, can generate significant heat. Use of Invar provides for more absolute positioning of the end of the actuator 26, and hence more accurate and useable stroke.

While the present invention has been illustrated by the description of specific embodiments thereof, and while the embodiments have been described in considerable detail, it is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of the general inventive concept.

What is claimed is:

1. A jetting dispenser, comprising:
    an actuator including a piezoelectric unit that lengthens by a first distance in response to an applied voltage, an armature operatively coupled to the piezoelectric unit, and an amplifier including a lever that extends from a first end thereof to a second end thereof opposite the first end thereof and a unitary and monolithically-formed flexural portion coupled to the first end of the lever, the first end of the lever moving through the first distance under the applied voltage and the second end of the lever moving through a second distance, larger than the first distance, under the applied voltage, wherein the first end of the lever is spaced apart from the armature along a first direction and the flexural portion is positioned between the first end of the lever and the armature along the first direction and directly connects the first end of the lever to the armature;
    a movable shaft operatively coupled with the second end of the lever; and
    a fluid body including a fluid bore and an outlet orifice, wherein the flexural portion flexes when voltage is applied to the piezoelectric unit so as to move the lever to oppose a resilient bias applied by the flexural portion, thereby moving the movable shaft to jet an amount of fluid from the fluid bore through the outlet orifice.

2. The jetting dispenser of claim 1, wherein the actuator further comprises an upper actuator portion containing the piezoelectric unit, and a lower actuator portion including the amplifier, the upper actuator portion formed from a first material having a first coefficient of thermal expansion and the lower actuator portion formed from a second material having a second coefficient of thermal expansion, wherein the first coefficient of thermal expansion is lower than the second coefficient of thermal expansion.

3. The jetting dispenser of claim 2, wherein a ratio of the first coefficient of thermal expansion to the second coefficient of thermal expansion is at least 1:5.

4. The jetting dispenser of claim 2, wherein the second material forming the lower actuator portion comprises stainless steel and the first material forming the upper actuator portion comprises a nickel-iron alloy.

5. The jetting dispenser of claim 1, wherein the actuator further comprises an upper actuator portion containing the piezoelectric unit, and a lower actuator portion including the amplifier, the amplifier being formed integrally with the lower actuator portion and including the flexural portion formed by a series of slots in the lower actuator portion.

6. The jetting dispenser of claim 1, wherein the actuator further comprises an upper actuator portion containing the piezoelectric unit, and a lower actuator portion including the amplifier.

7. The jetting dispenser of claim 1, wherein the armature is directly connected to the piezoelectric unit for movement with the actuator under the applied voltage and the flexural portion is formed integrally with the armature and includes a plurality of slots for providing flexure when the actuator moves through the first distance.

8. The jetting dispenser of claim 1, further comprising a pair of springs positioned on opposite sides of the piezoelectric unit, wherein the pair of springs are coupled to the piezoelectric unit in a manner that maintains the piezoelectric unit under constant compression.

9. The jetting dispenser of claim 8, wherein the pair of springs further comprise first and second flat springs.

10. The jetting dispenser of claim 9, wherein the actuator further comprises an upper actuator portion, and the first and second flat springs each include a first end and a second end, the first ends being fixed to the upper actuator portion and the second ends being fixed for movement with the amplifier under the applied voltage.

11. The jetting dispenser of claim 10, wherein the second ends are fixed to the armature, the armature being moved by the piezoelectric unit as the voltage is applied and removed.

12. A jetting dispenser, comprising:
an actuator including:
a piezoelectric unit that lengthens by a first distance in response to an applied voltage;
an amplifier including a lever that extends from a first end to a second end opposite the first end;
an armature positioned between the first end of the lever and the piezoelectric unit, the armature including a unitary and monolithically-formed flexural portion positioned between the lever and the armature and directly connecting the armature to the first end of the lever; and
a movable shaft operatively coupled with the second end of the lever; and
a fluid body including a fluid bore and an outlet orifice, wherein the flexural portion flexes when voltage is applied to the piezoelectric unit so as to cause movement of the lever, thereby moving the movable shaft to jet an amount of fluid from the fluid bore through the outlet orifice.

13. The jetting dispenser of claim 12, wherein the actuator further comprises an upper actuator portion containing the piezoelectric unit, and a lower actuator portion including the amplifier, the upper actuator portion formed from a first material having a first coefficient of thermal expansion and the lower actuator portion formed from a second material having a second coefficient of thermal expansion, wherein the first coefficient of thermal expansion is lower than the second coefficient of thermal expansion.

14. The jetting dispenser of claim 12, wherein the actuator further comprises an upper actuator portion containing the piezoelectric unit, and a lower actuator portion including the amplifier, the amplifier being formed integrally with the lower actuator portion and including the flexural portion formed by a series of slots in the lower actuator portion.

15. The jetting dispenser of claim 12, wherein the amplifier amplifies movement of the actuator from the first distance to a second distance under the applied voltage and the armature is directly connected to the piezoelectric unit for movement with the actuator under the applied voltage,
wherein the first end of the lever moves through the first distance under the applied voltage and the second end of the lever moves through the second distance, larger than the first distance, under the applied voltage, and
wherein the flexural portion is formed integrally with the armature and includes a plurality of slots for providing flexure when the actuator moves through the first distance.

16. The jetting dispenser of claim 12, wherein the flexural portion flexes when voltage is applied to the piezoelectric unit so as to cause clockwise rotation of the lever.

17. The jetting dispenser of claim 12, wherein the flexural portion includes a series of slots between the armature and the first end of the lever.

18. A jetting dispenser, comprising:
an actuator including a piezoelectric unit that lengthens by a first distance in response to an applied voltage and an amplifier including a lever that extends from a first end to a second end opposite the first end and a unitary and monolithically-formed flexural portion coupled to the first end of the lever, wherein the flexural portion is positioned between the lever and the piezoelectric unit and operatively couples the first end of the lever to the piezoelectric unit;
a movable shaft operatively coupled with the second end of the lever; and
a fluid body including a fluid bore and an outlet orifice, wherein the flexural portion flexes when voltage is applied to the piezoelectric unit so as to cause rotation of the second end of the lever to oppose a resilient bias applied by the flexural portion, and the rotation of the second end of the lever as the voltage is applied to the piezoelectric unit moves the movable shaft downward to jet an amount of fluid from the fluid bore through the outlet orifice.

19. The jetting dispenser of claim 18, further comprising an armature positioned between the flexural portion and the piezoelectric unit,
wherein the amplifier amplifies movement of the actuator from the first distance to a second distance under the applied voltage and the armature is directly connected to the piezoelectric unit for movement with the actuator under the applied voltage,
wherein the first end of the lever moves through the first distance under the applied voltage and the second end of the lever moves through the second distance, larger than the first distance, under the applied voltage, and
wherein the flexural portion is formed integrally with the armature and includes a plurality of slots for providing flexure when the actuator moves through the first distance.

20. The jetting dispenser of claim 18, wherein the flexural portion is mechanically fastened or linked to the first end of the lever.

* * * * *